United States Patent [19]
Young et al.

[11] Patent Number: 5,792,566
[45] Date of Patent: Aug. 11, 1998

[54] SINGLE CRYSTAL WAFERS

[75] Inventors: Gary Shen-Cheng Young, Fremont; Shan-Xiang Zhang, Cupertino, both of Calif.

[73] Assignee: American Xtal Technology, Fremont, Calif.

[21] Appl. No.: 678,420

[22] Filed: Jul. 2, 1996

[51] Int. Cl.[6] ................................................. H01L 21/304
[52] U.S. Cl. ........................... 428/688; 225/96; 225/96.5; 117/902
[58] Field of Search ................ 225/96.5, 96; 117/902; 428/688, 700

[56] References Cited

U.S. PATENT DOCUMENTS

| | | | |
|---|---|---|---|
| 3,507,426 | 4/1970 | Bielen et al. | 225/96.5 X |
| 3,743,148 | 7/1973 | Carlson | 225/96.5 X |
| 4,442,178 | 4/1984 | Kimura et al. | 117/902 X |
| 4,632,884 | 12/1986 | Shikatani et al. | 428/642 |
| 4,755,314 | 7/1988 | Sakaguchi et al. | 252/62.9 |

*Primary Examiner*—Daniel Zirker
*Attorney, Agent, or Firm*—John C. Albrecht

[57] ABSTRACT

Improved commercial single crystal wafers (250), as shipped to end users form a full circle, and comprise a "stress concentration notch" (172) which accurately defines a desired cleavage plane. The stress concentration notch is introduced into the wafers in bulk by means of a properly oriented cut along the length of a single crystal ingot, after machining the ingot to the desired end product diameter, and prior to sawing the ingot into slices. The stress concentration notch uniquely defines the first and second faces of the wafer.

6 Claims, 1 Drawing Sheet

SINGLE CRYSTAL WAFERS

TECHNICAL FIELD

This invention relates to improved wafers prepared from single crystal ingots and to a method of manufacture thereof

BACKGROUND OF THE INVENTION

Wafers which are prepared from single crystal ingots of a variety of materials are used in manufacturing applications which require division of a wafer into components by cleaving along natural cleavage planes of the wafer. GaAs, GaN, AlN, and InP are representative examples of useful wafer materials for such applications; and the manufacture of lasers is a relevant example of a manufacturing application.

In the prior art, wafers, which are provided to a manufacturer, have a major Orientation Flat, termed an "OF" herein, that defines a selected set of natural cleavage planes of the wafer. In a first form, the wafers have orthogonally oriented major and minor Orientation Flats that are generated by grinding the ingot before slicing. A second form of wafer comprises a cleaved major OF and a ground minor OF.

The purpose of the minor flat is to, in combination with the major flat, uniquely identify the two plane surfaces of the wafer. For example, if, in geographic terms, the major flat is placed to face south, and the minor flat faces west, the surface of the wafer facing the viewer is the first surface. Similarly, if the major flat is placed to face south and the minor flat faces east, the surface facing the viewer is the second surface. The ability to uniquely determine the two plane surfaces of a wafer is useful in all cases, and is extremely important in the cases of wafers in which both faces are polished.

Unfortunately, ground Orientation Flats are lacking in precision in their definition of natural cleavage planes. When a wafer with ground flats is to be used in an application that requires high precision in the definition of cleavage planes, the wafer must be scored and cleaved parallel to the ground OF at a distance sufficient to permit the wafer to be held during cleaving, e.g., 5 to 6 mm between the ground OF and the first cleaved plane. Thus, the portion of the wafer between the ground flat and the first line of cleavage is lost.

Because of the high cost of wafers and of component processing, any loss of wafer surface is a serious economic problem.

Furthermore, post processing of finished wafers to produce components is complicated by the presence of a reference flat. For example, where post processing includes deposition of an EPI layer, the flat causes an unwanted pattern of gas flow around the wafer, differential dissipation of heat from the wafer, and resulting mechanical deformation of the wafer. Additionally, unless the reference flat is protected during growth of an EPI layer, the layer tends to crown adjacent the flat and thus reduces the accuracy of the flat as a reference.

DISCLOSURE OF THE INVENTION

In accordance with the present invention, our improved commercial wafers, as shipped to an end user, form a full circular plane and comprise a relatively narrow, shallow, and soft bottomed "stress concentration notch" which facilitates cleavage at a desired point in the post processing of such wafers to produce components. While the notch facilitates cleavage, the mechanical strength of the wafer is retained and there is little or no chance of premature accidental cleavage prior to or during post processing.

Advantageously, our present invention can be employed with wafers composed of any single crystal material that exhibits families of natural clevage planes.

Advantageously, our improved wafers can be processed to form components without the surface losses incurred with wafers which comprise ground Orientation Flats, and without the described complications incurred in growth of an EPI layer on wafers with Orientation Flats. Additionally, since our stress concentration notch is not pointed toward the center of the wafer surface, the position of the notch fully defines which surface of the wafer is facing a viewer. For example, if the wafer is oriented so that the notch runs from west to east and is located in the southwest quadrant of the wafer, the viewer is facing the "first" surface. Similarly, if the wafer is oriented so that the notch runs from east to west and is located in the southeast quadrant of the wafer, the viewer is facing the "second" surface. The ability to locate the first and second plane surfaces is important in most cases, and vital in the case of wafers with two polished faces.

Wafers in accordance with our present invention are produced as follows:

(1) Ingot is machined to a perfect cylinder at near the desired end product diameter;

(2) A desired natural cleavage plane of the ingot is determined;

(3) A shallow, soft bottom, narrow cut, aligned with the determined plane, is made along the length of the ingot;

(4) Ingot is sliced into wafers:

(5) Edges of the wafers, as required, are ground to the finished diameter;

(6) Edges of the wafer are bevelled;

(7) Wafers are polished;

(8) Wafers are: cleaned;

(9) Wafers are packaged & shipped to an end user.

Production of wafers in accordance with the present invention, economically provides improved commercial wafers without loss of accuracy in the definition of the reference cleavage plane.

THE DRAWING

DETAILED DESCRIPTION

Figure 1:
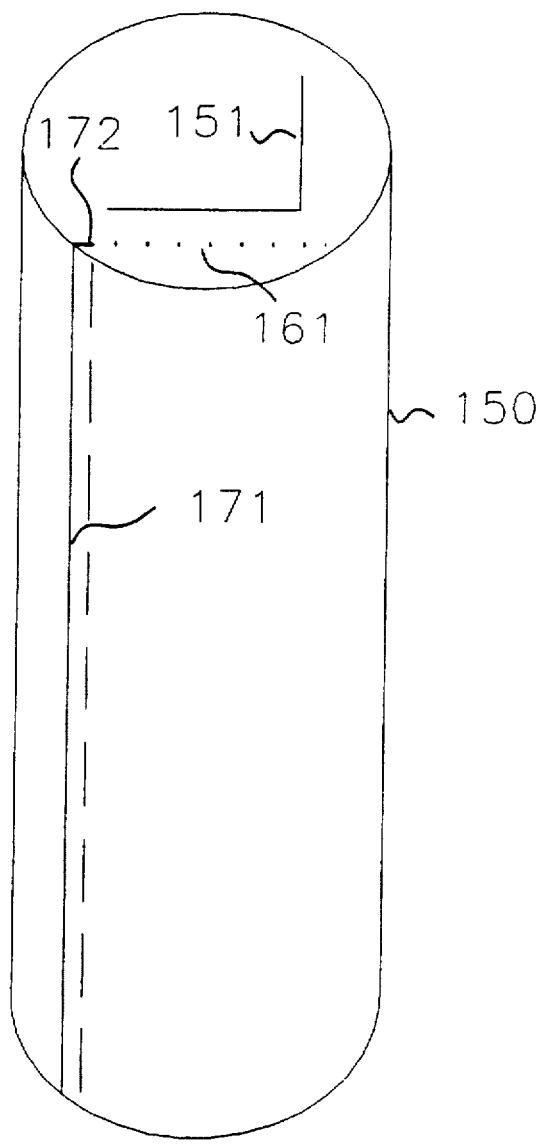
FIG. 1 is a perspective view of an ingot with a longitudinal cut in accordance with the present invention.
Figure 2:
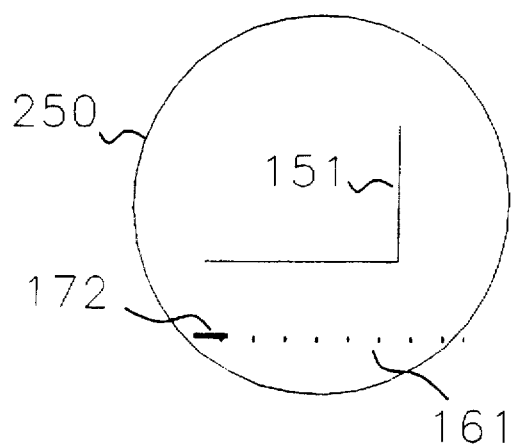
FIG. 2 is a top view of an improved wafer sliced from the ingot of FIG. 1.
Figure 3:
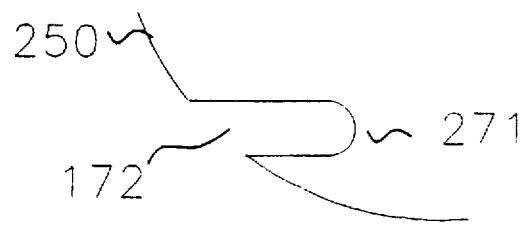
FIG. 3 is an exploded view of the stress concentration notch 172.

FIG. 1 is a perspective view of an ingot 150 used in the preparation of the wafers of FIG. 2. The orthogonal lines 151 represent any selected set of natural cleavage planes of ingot 150 and of the resulting wafers 250 sliced therefrom. Although the diameter and length of an ingot are not critical to the practice of our present invention, an ingot, by way of example, may have a two inch diameter and a length of four to six inches. The figures of the drawing are not made to scale.

Wafers in accordance with the present invention are produced as follows:

(1) Ingot 150 is machined to a perfect cylinder at near the desired end product diameter;

(2) A selected reference cleavage plane 161 of ingot 150 is determined;

(3) A cut 171, aligned with the selected cleavage plane 161, is made along the length of the ingot;

(4) Ingot is sliced into wafers 250;

(5) Edges of the wafers, as required, are ground to the finished diameter;

(6) Edges of the wafer are bevelled;

(7) Wafers 250 are polished;

(8) Wafers are cleaned;

(9) Wafers are packaged.

The manufacture of wafers in accordance with our present invention is more economical than prior art processes; and results in an enhanced end user products which admit of simplifications in post processing to construct components from such wafers.

For example, where post processing of a wafer by a manufacturer includes deposition of an EPI layer, the use of full circle wafers avoids unwanted patterns of gas flow around the wafer; differential dissipation of heat from the wafer; and the resulting unwanted mechanical distortion of the wafer. Furthermore the manufacturing process is simplified since there is no flat to protect.

FIG. 2 is a top view of a commercial wafer 250, in accordance with the present invention. Our improved wafer comprises a full circular plane with a "stress concentration notch" 172 formed by longitudinal cut 171. By way of example, cut 171 may be formed by a saw cut, a wire cut, or may be formed by laser action. Solely, by way of example, notch 172 may be a few mils wide, and 2 to 3 millimeters deep. Advantageously, notch 172 includes a radius 271. Radius 271 reduces any tendency of the wafer to prematurely cleave due to the presence of notch 172. During post processing, a small score is made in the wafer near the end of notch 172 at the point in time that the initial cleave is to be made. Thereafter, when the wafer is flexed parallel to the desired cleavage plane, notch 172 facilitates cleavage by concentrating the forces applied at or near the score.

The invention has been described with particular attention to its preferred embodiment; however, it should be understood that variations and modifications within the spirit and scope of the invention may occur to those skilled in the art to which the invention pertains.

What is claimed is:

1. A single crystal wafer (250) comprising:

a circular plane body comprising: a finished edge; first and second major plane faces, and a stress concentration notch (172), said stress concentration notch (172) being located at said finished edge and extending through said major faces along the line of a selected natural cleavage plane of the wafer.

2. A single crystal wafer in accordance with claim 1 characterized in that said stress concentration notch (172) forms a radius (271) at the bottom thereof.

3. A single crystal wafer in accordance with claim 1 characterized in that said finished edge is bevelled.

4. A single crystal wafer in accordance with claim 1 characterized in that said wafer is composed of Gallium Arsenide.

5. A single crystal wafer in accordance with claim 1 characterized in that said wafer is composed of Indium Phosphide.

6. A single crystal wafer in accordance with claim 1 characterized in that said wafer is composed of any single crystal material that exhibits families of natural cleavage planes.

\* \* \* \* \*